US006700444B2

United States Patent
Pengelly

(10) Patent No.: US 6,700,444 B2
(45) Date of Patent: Mar. 2, 2004

(54) N-WAY RF POWER AMPLIFIER WITH INCREASED BACKOFF POWER AND POWER ADDED EFFICIENCY

(75) Inventor: Raymond Sydney Pengelly, Hillsborough, NC (US)

(73) Assignee: Cree Microwave, Inc., Sunnyvale, CA (US)

(*) Notice: Subject to any disclaimer, the term of this patent is extended or adjusted under 35 U.S.C. 154(b) by 67 days.

(21) Appl. No.: 10/059,866

(22) Filed: Jan. 28, 2002

(65) Prior Publication Data

US 2003/0141933 A1 Jul. 31, 2003

(51) Int. Cl.$^7$ .............................. H03F 3/68; H03F 3/04
(52) U.S. Cl. .................. 330/295; 330/124 R; 330/302
(58) Field of Search ............................. 330/124 R, 295, 330/302

(56) References Cited

U.S. PATENT DOCUMENTS

| | | | |
|---|---|---|---|
| 3,579,136 A | | 5/1971 | Machamer |
| 5,420,541 A | | 5/1995 | Upton et al. |
| 5,757,229 A | * | 5/1998 | Mitzlaff .................. 330/124 R |
| 5,786,727 A | | 7/1998 | Sigmon |
| 5,966,059 A | * | 10/1999 | Sigmon ...................... 333/128 |
| 6,097,252 A | | 8/2000 | Sigmon et al. |
| 6,262,629 B1 | * | 7/2001 | Stengel et al. .......... 330/124 R |
| 6,374,092 B1 | | 4/2002 | Leizerovich et al. |
| 6,396,341 B1 | | 5/2002 | Pehlke |
| 6,445,247 B1 | | 9/2002 | Walker |
| 6,448,616 B1 | | 9/2002 | Perugupalli et al. |

OTHER PUBLICATIONS

"The Dougherty Amplifier Product Review," Product Brochure, circa 1937.

McMorrow, Robert J. et al., "The Microwave Doherty Amplifier," 1994 IEEE MTT–S Digest, pp. 1653–1656 (1994).

Upton, David M. et al., A New Circuit Topology to Realize High Efficiency, High Linearity, and High Power Microwave Amplifiers, RAWCON'98 Proceedings, pp. 317–320 (1998).

Yang, Youngoo et al., "Experimental Investigation on Efficiency and Linearity of Microwave Doherty Amplifier," 2001 IEEE MTT–S Digest, Phoenix, AZ, 4 pp. (2001).

Iwamoto, Masaya et al., "An Extended Doherty Amplifier with High Efficiency Over a Wide Power Range," 2001 IEEE MTT–S Digest, Phoenix, AZ, 4 pp. (2001).

\* cited by examiner

*Primary Examiner*—Patricia Nguyen
(74) *Attorney, Agent, or Firm*—Beyer Weaver & Thomas, LLP

(57) ABSTRACT

An RF power amplifier for amplifying an RF signal over a broad range of power with improved efficiency includes a main amplifier for amplifying an RF signal over a first range of power and with a power saturation level below the maximum of the broad range of power. A plurality of auxiliary amplifiers are connected in parallel with the main amplifier with each of the auxiliary amplifiers being biased to sequentially provide an amplified output signal after the main amplifier approaches saturation. The input signal is applied through a signal splitter to the main amplifier and the plurality of auxiliary amplifiers, and an output for receiving amplified output signals from the main amplifier and the plurality of auxiliary amplifiers includes a resistive load R/2. The split input signal is applied through a 90° transformer to the main amplifier, and the outputs of the auxiliary amplifiers are applied through 90° transformers to a output load. When operating below saturation, the main amplifier delivers power to a load of 2R and the main amplifier delivers current to the load which is one-half the current at maximum power and the amplifier is saturated.

8 Claims, 3 Drawing Sheets

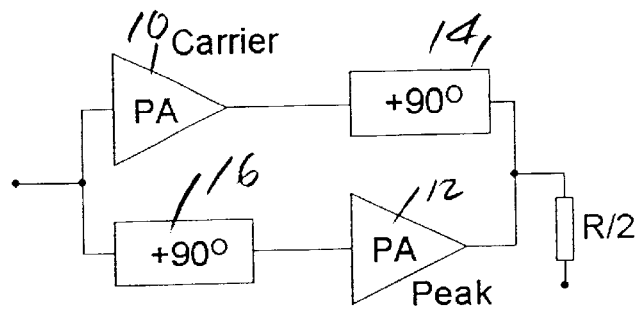
(PRIOR ART) Fig. 1 (a) Condition for Peak Output Power
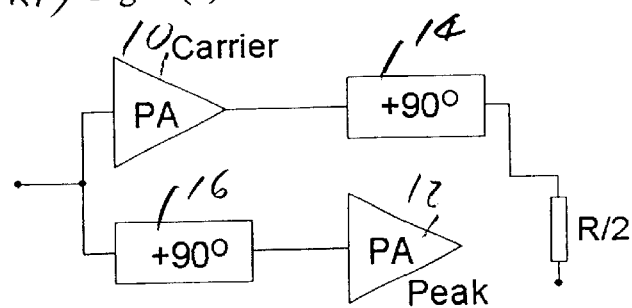
(PRIOR ART) Fig. 1 (b) Condition for Low Input Power
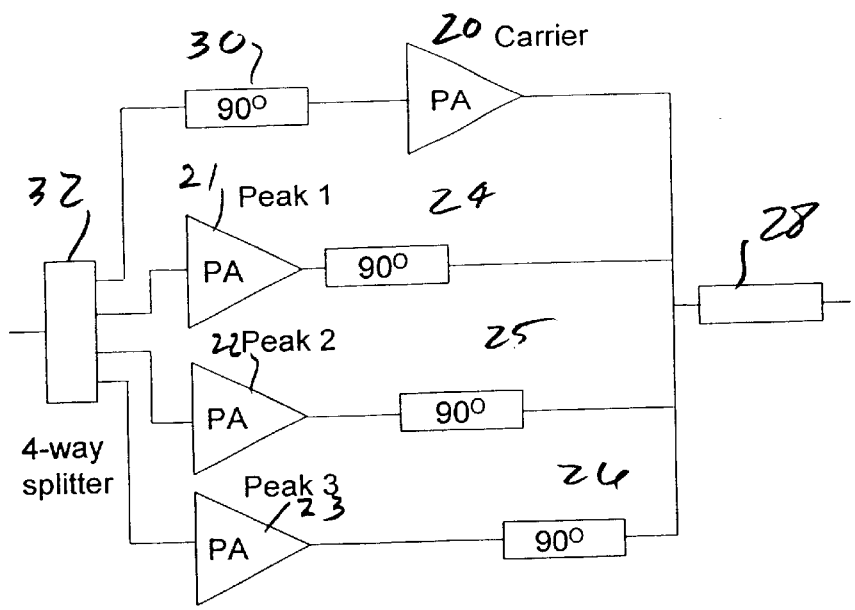
FIG. 2

N-WAY RF POWER AMPLIFIER WITH INCREASED BACKOFF POWER AND POWER ADDED EFFICIENCY

BACKGROUND OF THE INVENTION

This invention relates generally to RF power amplifiers, and more particularly the invention relates to an RF power amplifier suitable for modern wireless communication systems, which require a wide range of output power in basestations where digital modulation is being employed.

Power amplifiers in basestations often operate at output power levels much lower than peak power. Unfortunately, the back-off power level reduces the efficiency of the power amplifier in the transmitter. In a conventional amplifier there is a direct relationship between efficiency and the input drive level. Therefore, high efficiency (DC to RF conversion efficiency) is not obtained until the RF input power level becomes sufficiently high to drive the amplifier into saturation. Since in multicarrier communication systems an amplifier must remain as linear as possible, this region of high efficiency cannot be used.

A conventional power amplifier design which provides improved efficiency in back-off power levels is the Doherty amplifier, which combines power from a main amplifier and from an auxiliary or peak amplifier. See, W. H. Doherty, "A New High-Efficiency Power Amplifier for Modulated Waves," Proc. IRE Vol. 24, No. 9, pp. 1163–1182, 1936. In the conventional Doherty configuration, the carrier amplifier 10 and peak amplifier 12 are designed to deliver maximum power with optimum efficiency to a load R, as shown in FIG. 1(A). The main or carrier amplifier is a normal Class B amplifier, while the peak amplifier is designed to only amplify signals which exceed some minimum threshold. For an LDMOS power transistor, this can be accomplished by DC biasing the transistor below its pinch-off voltage for operation similar to Class C. The outputs of the two amplifiers are connected by a quarter-wave transmission line of impedance R, and a load of one-half of the optimum load R is attached to the output of the peak amplifier. The RF input power is divided equally with a quarter-wave delay at the input to the peak amplifier, thus assuring that the output power of the two amplifiers at the load R/2 will be in phase.

The Doherty amplifier achieves high efficiency prior to compression by operating the Class B main amplifier into a load impedance two times larger than its optimum load. This amplifier compresses and reaches peak efficiency at half of its maximum power. The second or peak amplifier is made active only during the peaks of the input signal and is used to modulate the load impedance apparent at the output of the main amplifier. Maximum efficiency is again achieved when the second amplifier puts out its full power. Thus, the first amplifier is kept on the verge of saturation for a 6 dB range of outward power and near peak efficiency can be maintained.

When the input RF power into the Doherty amplifier is not sufficient to turn on the peak amplifier, all of the output power is supplied by the main or carrier amplifier. When the peak amplifier is off, it's output impedance is very high and the output power of the carrier amplifier is entirely delivered to load R/2, as shown in FIG. 1(B). The load actually presented to the carrier amplifier across the quarter-wave transformer is 2R. The device current is therefore one-half of what is delivered at maximum power while the voltage is saturated. This results in the device delivering half its maximum output power. Since both the RF and DC components of the current are half their peak values, the efficiency will be at its maximum with half of the maximum output power of the carrier amplifier being supplied to the load with maximum linear efficiency.

When sufficient input RF power is provided to allow the peak amplifier to become saturated, as in FIG. 1(A), two parallel amplifiers are evenly delivering maximum output power to the load R/2. The load apparent to each amplifier is the optimum load R, and the load at both ends of the quarter-wave transformer will remain at R. The peak amplifier is designed to begin operation when the carrier amplifier just begins to saturate. Maximum linear efficiency is obtained at this point. As the input RF drive is further increased, the peak amplifier begins to turn on and deliver output power to the load. The additional current supplied by the peak amplifier has the effect of increasing the load impedance at the output of the quarter-wave transformer. The effective change at the carrier amplifier end of the transformer will be a reduction in the apparent load impedance and enabling the carrier amplifier to deliver more power while its voltage remains saturated. The efficiency between the limits will fall off only slightly from the maximum since the duty factor of the peak amplifier is relatively low.

Attempts have been made to extend the range of high efficiency operation of the Doherty amplifier. For example, Iwamoto et al. have produced a 12 dB back-off circuit using scaled transistors or different sized transistors in the carrier and peak amplifiers and an unequal power splitter at the input. See, Iwamoto et al. "An Extended Doherty Amplifier with High Efficiency Over a Wide Power Range," 2001 IEEE MTT-S Digest, Phoeniz, Ariz. This technique apparently works well when the total output power is low (less than 10 watts), but with limited improvement when the output power is in the 10–100 watt CW range.

The present invention provides an extended range of high efficiency operation for an RF power amplifier.

BRIEF SUMMARY OF THE INVENTION

In accordance with the invention, an RF power amplifier includes a main or carrier amplifier for maximum back-off power operation and a plurality of auxiliary or peak amplifiers which are suitably biased to begin operation sequentially for increasing power requirements. Each peak amplifier can provide an increase of 6 dB in the power range over which the peak efficiency will be maintained. Since an N way splitter is required for providing an input signal to the main amplifier and N−1 peak amplifiers, a finite loss of power in the splitter causes some degradation of efficiency.

In a preferred embodiment, a 4-way amplifier is provided and includes a main amplifier and three peak amplifiers all driven by a 4-way power splitter. Theoretically, this amplifier extends the range of efficient power by 18 dB. Such extension in efficient power range is very important in digital communication systems using modulation schemes such as wideband CDMA (W-CDMA) or OFDM where the peak to average power ratios can be as high as 13 dB. The 4-way configuration also provides an overall power increase of 3 dBm compared to a 2-way amplifier arrangement. Thus a 120 watt peak amplifier can be provided by a 4-way arrangement with each amplifier path (carrier and 3 peak amplifiers) utilizing 30 watt transistors.

The invention and objects and features thereof will be more readily apparent from the following detailed description and appended claims when taken with the drawings.

BRIEF DESCRIPTION OF THE DRAWINGS

FIG. 1(A) and FIG. 1(B) are schematics of a conventional Doherty amplifier.

FIG. 2 is a schematic of a 4-way power amplifier in accordance with one embodiment of the invention.

DETAILED DESCRIPTION OF THE INVENTION

Figure 3:
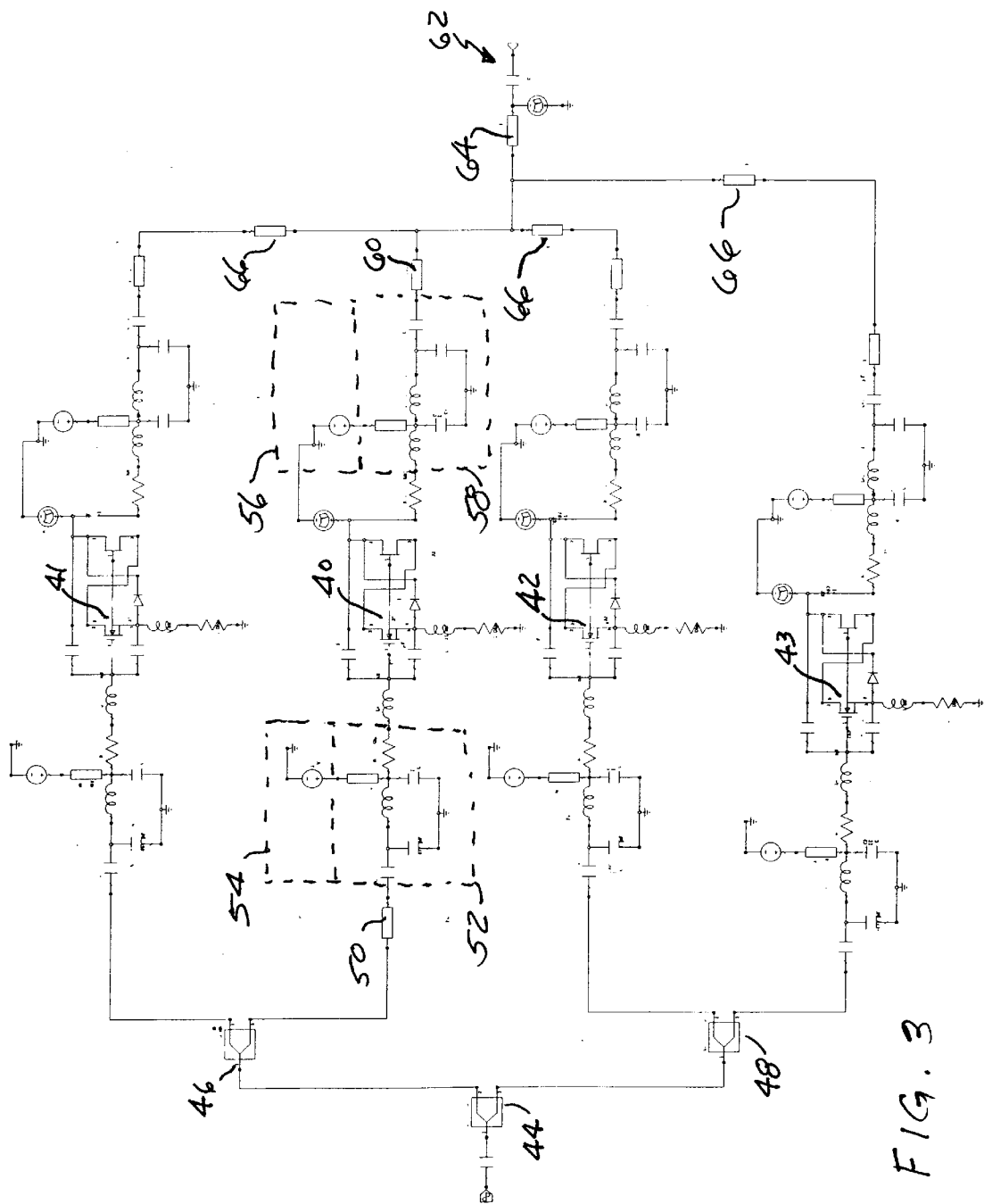
FIG. 3 is a more detailed schematic of the 4-way amplifier of FIG. 2.

The invention can be regarded as a modification of the Doherty power amplifier with the addition of a plurality of peak amplifiers and the provision of an N-way splitter for the main carrier amplifier and N–1 peak amplifiers. In order to ease the practical construction of the amplifier, the conventional Doherty amplifier quarter-wave transformers on the input to the peak amplifier and on the output of the carrier amplifier are swapped, without affecting performance. Only one single 90° (quarter-wave) phase length is needed on the carrier amplifier input and thus allows easier implementation of multiple peaking amplifiers through a multiway power divider.

FIG. 2 is a functional block diagram of one embodiment of the power amplifier in accordance with the invention, which includes a carrier amplifier 20 and the three peak amplifiers 21, 22, 23, with the peak amplifiers connected through 90° transformers 24, 25, 26 to output load 28. A single 90° transformer 30 connects a 4-way splitter 32 to carrier 20. By setting the DC bias on each of the peak amplifiers to appropriate values, the added peak amplifiers allow the Doherty action to be extended. For each peak amplifier that is added above the first, there will be a corresponding increase of 6 dB in the power range over which the peak efficiency will be maintained. Some degradation in efficiency will result due to the finite loss in the N-way splitter. The 4-way amplifier extends the range of efficient power to a theoretical value of 18 dB. As noted above, such extension is very important in digital communication systems using modulation schemes where the peak to average power ratios can be as high as 13 dB. The 4-way configuration provides an overall power increase of 3 dBm compared to a 2-way conventional Doherty circuit. Thus, a 120 watt peak amplifier can be provided by a 4-way Doherty arrangement with each path (carrier and 3 peak amplifiers) utilizing 30 watt transistors.

FIG. 3 is a more detailed schematic of the amplifier of FIG. 2 which has been simulated using 30 watt LDMOSFET power transistors from Ultra RF assignee, including a main amplifier transistor 40 and 3 peak amplifier transistors 41–43. Four-way splitting of the input signals is provided by 2-way splitters 44, 46, and 48. Main transistor amplifier 40 includes a 90° transformer 50 which connects splitter 46 to input matching circuit 52. Gate bias 54, drain bias 56, an output matching circuit 58, and an offset microstrip phase length 60 serially connect the amplifier between phase splitter 46 and the output at 62 including a transformer 64 and resistive load 65. Each of the peak amplifiers has a 90° transformer 66 connecting the amplifier circuitry to the load, as shown in FIG. 2. A harmonic termination e.g., grounded inductor and capacitor, can be included in output matching circuit 58 to reflect output harmonics back into the transistor output and hence increase peak efficiency. Each of the peak amplifier circuits have similar input and output circuits with the gate bias circuits providing sequential operation of the peak amplifiers as input signal strength increases.

Figure 4:
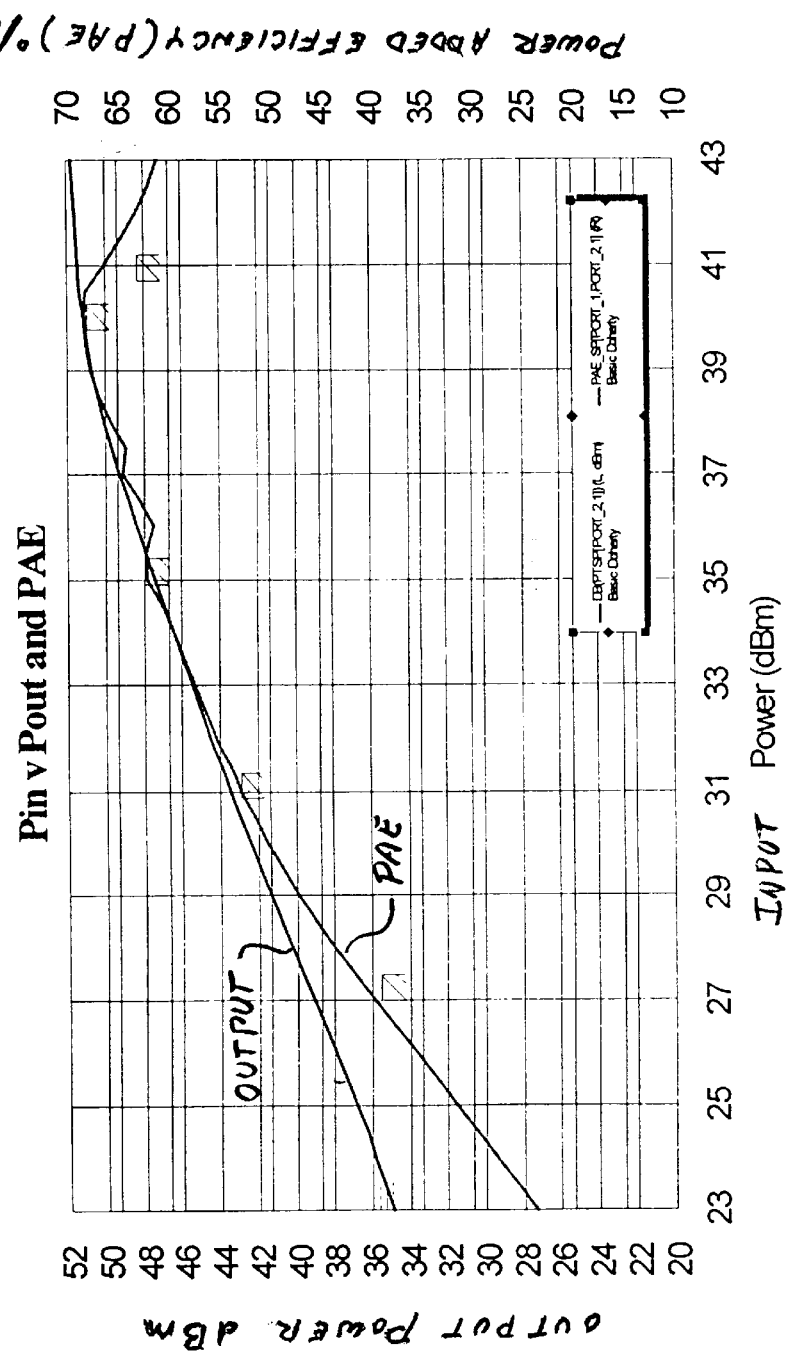
FIG. 4 is a graph illustrating power-out versus power-in and power added efficiency for a simulated power amplifier according to FIGS. 2 and 3.

The 4-way amplifier of FIG. 3 was simulated using an Agilent ADS Simulator over the UMTS band (2110–2170 MHz) for output power, power added efficiency (PAE), and gain. FIG. 4 shows input RF power versus output RF power, as well as PAE over a range of input powers extending from 23–43 dBm (200 milliwatts to 20 watts) with a saturated output close to 150 watts (52 dBm. When the output power level is backed off to 42 dBm (10 dB backoff) the PAE is 46%. A conventional amplifier would have a PAE of less than 10% for the same back-off power. A conventional 2-way Doherty amplifier would have a corresponding PAE of 23%. It is important in the selection of the bias voltages for the peak amplifiers that the transistors turn on sequentially at the correct points to maintain gain linearity over the full dynamic range of the amplifier.

Table 1 shows a comparison between the conventional 2-way Doherty amplifier, the 2-way Doherty amplifier with unequal power split as described by Iwamoto et al., a 3-way (main amplifier with 2 peak amplifiers) in accordance with an embodiment of the invention, and a 4-way split (main amplifier with 3 peak amplifiers). It will be noted that the 4-way amplifier achieves a factor of 2 improvement in PAE over the conventional approach.

| Configuration | SS Gain, dB | P1dB, dBm | PAE @ P1dB, % | PAE @ 7 dB back-off, % | PAE @ 10 dB back-off, % | Circuit Complexity |
|---|---|---|---|---|---|---|
| 180 watt 2-way Doherty with unequal power split | 13.5 | 52 | 65 | 31.5 | 20.3 | Medium |
| 3 × 60 watt 2-way Doherty with "Upton" phase lengths | 11 | 53.2 | 55 | 32 | 23 | High |
| 2 × 90 watts 3-way Doherty | 11 | 52.4 | 62 | 45 | 35 | High |
| 2 × 120 watt 4-way Doherty | 11 | 53.9 | 63 | 52 | 44 | High |

An N-way Doherty amplifier in accordance with the invention gives major improvements in power added efficiency for linear power amplifiers over a wide range of input/output power levels. The amplifier is particularly suitable for high power amplifiers because the power requirement of each transistor is inversely proportional to the number of power transistors N. In a conventional 2-way Doherty configuration, the peak power requirement of each transistor is forced to be one-half of the total output power. Such a condition leads to very low input and output impedances for the carrier and peak amplifiers and leading to practical realization difficulties. With the present invention, each transistor needs to have a peak power requirement of 1/N output power, thus leading to higher input and output impedances when N is greater than 2. In addition, the heat generated by the remaining inefficiency in the amplifier is distributed over a larger physical area due to the use of smaller individual transistors, thus reducing total thermal resistance.

While the invention has been described with reference to a specific 4-way embodiment, the description is illustrative of the invention and is not to be construed as limiting the invention. Various modifications and applications may occur to those skilled in the art without departing from the true spirit and scope of the invention as defined by the appended claims.

What is claimed is:

1. A high power RF power amplifier suitable for use in a wireless communication basestation for amplifying an RF signal over a broad range of power comprising:
    a) a main amplifier comprising a lateral DMOS transistor for amplifying the RF signal over a first range of power and with a power saturation level below the maximum of the broad range of power,
    b) a plurality of auxiliary amplifiers comprising lateral DMOS transistors connected in parallel with the main amplifier, each of the auxiliary amplifiers being biased to sequentially provide an amplified output signal after the main amplifier approaches saturation,
    c) a signal splitter for splitting an input signal and applying the split input signal to the main amplifier and to the plurality of auxiliary amplifiers, the signal splitter including a quarter-wave transformer connected to the input of the main amplifier, and
    d) an output for receiving and combining amplified output signals from the main amplifier and from the plurality of auxiliary amplifiers, the output including a resistive load connected to the output of the main amplifier and connected to the output of each auxiliary amplifier through a quarter-wave transformer.

2. The RF power amplifier as defined by claim 1, wherein each auxiliary amplifier extends efficient power amplification by 6 dB.

3. The RF power amplifier as defined by claim 2, wherein the plurality of auxiliary amplifiers is three peak amplifiers and the extended efficient power amplification is approximately 18 dB.

4. The RF power amplifier as defined by claim 3, wherein the signal splitter includes a quarter-wave transformer connected to the input of the main amplifier, and the output includes a resistive load connected to the output of the main amplifier and connected to the output of each auxiliary amplifier through a quarter-wave transformer.

5. An RF power amplifier for amplifying an RF signal over a broad range of power comprising:
    a) a main amplifier for amplifying the RF signal over a first range of power and with a power saturation level below the maximum of the broad range of power,
    b) a plurality of auxiliary amplifiers connected in parallel with the main amplifier, each of the auxiliary amplifiers being biased to sequentially provide an amplified output signal after the main amplifier approaches saturation, wherein the plurality of auxiliary amplifiers is three peak amplifiers and the extended efficient power amplification is approximately 18 dB, each of the main amplifier and auxiliary amplifiers comprising a lateral DMOS transistor,
    c) a signal splitter for splitting an input signal and applying the split input signal to the main amplifier and to the plurality of auxiliary amplifiers, wherein the signal splitter includes a quarter-wave transformer connected to the input of the main amplifier, and
    d) an output for receiving and combining amplified output signals from the main amplifier and from the plurality of auxiliary amplifiers, the output including a resistive load of R/2 connected to the output of the main amplifier and each auxiliary amplifier is connected to the load through a quarter-wave transmission line of impedance R.

6. The RF power amplifier as defined by claim 5, wherein below saturation the main amplifier provides current to a load of 2R whereby current is one-half of maximum power current for when the amplifier is saturated.

7. An RF power amplifier for amplifying an RF signal over a broad range of power comprising:
    a) a main amplifier for amplifying the RF signal over a first range of power and with a power saturation level below the maximum of the broad range of power,
    b) a plurality of auxiliary amplifiers connected in parallel with the main amplifier, each of the auxiliary amplifiers being biased to sequentially provide an amplified output signal after the main amplifier approaches saturation,
    c) a signal splitter for splitting an input signal and applying the split input signal to the main amplifier and to the plurality of auxiliary amplifiers, and
    d) an output for receiving and combining amplified output signals from the main amplifier and from the plurality of auxiliary amplifiers, the output including a resistive load of R/2 connected to the output of the main amplifier and each auxiliary amplifier is connected to the load through a quarter-wave transmission line of impedance R.

8. The RF power amplifier as defined by claim 7, wherein below saturation the main amplifier provides current to a load of 2R whereby current is one-half of maximum power current for when the amplifier is saturated.

* * * * *